US012660424B2

(12) United States Patent
Zhang et al.

(10) Patent No.: US 12,660,424 B2
(45) Date of Patent: Jun. 16, 2026

(54) PIXEL ARRANGEMENT STRUCTURE, MASK COMPONENT AND DISPLAY PANEL

(71) Applicant: Hefei Visionox Technology Co., Ltd., Hefei (CN)

(72) Inventors: Haohan Zhang, Hefei (CN); Yuan Yao, Hefei (CN); Mingxing Liu, Hefei (CN); Yiming Xiao, Hefei (CN); Li Zhao, Hefei (CN)

(73) Assignee: Hefei Visionox Technology Co., Ltd., Hefei (CN)

( * ) Notice: Subject to any disclaimer, the term of this patent is extended or adjusted under 35 U.S.C. 154(b) by 368 days.

(21) Appl. No.: 18/340,289

(22) Filed: Jun. 23, 2023

(65) Prior Publication Data

US 2023/0337478 A1    Oct. 19, 2023

Related U.S. Application Data

(63) Continuation of application No. PCT/CN2022/081624, filed on Mar. 18, 2022.

(30) Foreign Application Priority Data

Jun. 17, 2021    (CN) .......................... 202110675049.7

(51) Int. Cl.
| | |
|---|---|
| *H10K 59/122* | (2023.01) |
| *H10K 59/35* | (2023.01) |
| *H10K 71/16* | (2023.01) |

(52) U.S. Cl.
CPC ......... *H10K 59/122* (2023.02); *H10K 59/353* (2023.02); *H10K 71/166* (2023.02)

(58) Field of Classification Search
CPC ............................................. H10K 59/35–353
See application file for complete search history.

(56) References Cited

U.S. PATENT DOCUMENTS

| | | |
|---|---|---|
| 2011/0260952 A1 | 10/2011 | Hwang et al. |
| 2013/0113363 A1 | 5/2013 | Hong |
| | (Continued) | |

FOREIGN PATENT DOCUMENTS

| | | |
|---|---|---|
| CN | 205355055 U | 6/2016 |
| CN | 109300958 A | 2/2019 |
| | (Continued) | |

OTHER PUBLICATIONS

First Office Action issued on Jun. 21, 2022, in corresponding Chinese Application No. 202110675049.7, 13 pages.

(Continued)

*Primary Examiner* — Mariceli Santiago
(74) *Attorney, Agent, or Firm* — Maier & Maier, PLLC

(57) ABSTRACT
A pixel arrangement structure. The pixel arrangement structure includes a plurality of pixel units, each pixel unit includes: a first pixel group including a first sub-pixel and a second sub-pixel distributed along a first direction, the first sub-pixel and the second sub-pixel have first opening sides and second opening sides respectively; a second pixel group including two third sub-pixels distributed along the first direction, one third sub-pixel is arranged between the first sub-pixel and the second sub-pixel, and each third sub-pixel has two third opening sides opposite to each other and two fourth opening sides opposite to each other, two adjacent rows of the pixel units along a second direction are staggered, and the third opening sides and fourth opening sides each overlaps with one of the first.

18 Claims, 6 Drawing Sheets

(56)                References Cited

U.S. PATENT DOCUMENTS

| | | | |
|---|---|---|---|
| 2014/0071030 A1* | 3/2014 | Lee | H10K 59/353 |
| | | | 345/82 |
| 2016/0322433 A1 | 11/2016 | Kim et al. | |
| 2018/0053811 A1 | 2/2018 | Wacyk | |
| 2020/0273924 A1* | 8/2020 | Xiao | C23C 14/24 |
| 2022/0310707 A1* | 9/2022 | Li | H10K 59/353 |

FOREIGN PATENT DOCUMENTS

| | | | |
|---|---|---|---|
| CN | 109994503 A | 7/2019 |
| CN | 109994506 A | 7/2019 |
| CN | 110137206 A | 8/2019 |
| CN | 110828534 A | 2/2020 |
| CN | 111341817 A | 6/2020 |
| CN | 111785755 A | 10/2020 |
| CN | 112368840 A | 2/2021 |
| CN | 112382649 A | 2/2021 |
| CN | 112470287 A | 3/2021 |
| CN | 113327972 A | 8/2021 |
| CN | 113327973 A | 8/2021 |
| CN | 113437122 A | 9/2021 |
| JP | 2002221917 A | 8/2002 |
| KR | 1020160104804 A | 9/2016 |
| KR | 1020170112894 A | 10/2017 |
| KR | 1020190137198 A | 12/2019 |

OTHER PUBLICATIONS

Notification to Grant Patent Right for Invention issued on Sep. 2, 2022, in corresponding Chinese Application No. 202110675049.7, 6 pages.

Office Action issued on Feb. 27, 2024, in corresponding Japanese Application No. 2023-540217, 8 pages.

International Search Report mailed on May 26, 2022, in corresponding International Application No. PCT/CN2022/081624, 6 pages.

Office Action issued on Nov. 14, 2025, in corresponding Korean Application No. 1020237021974, 6 pages.

* cited by examiner

110

120

130

20

30

PIXEL ARRANGEMENT STRUCTURE, MASK COMPONENT AND DISPLAY PANEL

CROSS-REFERENCE TO RELATED APPLICATIONS

The present application is a continuation of International Application No. PCT/CN2022/081624, filed on Mar. 18, 2022, which claims priority to Chinese Patent Application No. 202110675049.7 filed on Jun. 17, 2021, and entitled "PIXEL ARRANGEMENT STRUCTURE, MASK COMPONENT AND DISPLAY PANEL", both of which are hereby incorporated by reference in their entireties.

TECHNICAL FIELD

The present application relates to the field of display technology, and in particularly to a pixel arrangement structure, a mask component and a display panel.

BACKGROUND

The organic light-emitting diode (OLED) is an active light-emitting device. Compared with the traditional liquid crystal display (LCD), the OLED display technology does not require a back light, and has a feature of a self-illumination. A relatively thin film layer of an organic material and a glass substrate are used in the OLED, and the organic material emits light under a condition that an electric current passes through. Accordingly, an OLED display panel can save power significantly, may be made lighter and thinner, can withstand a wider range of temperature variations than an LCD display panel, and may have a larger viewing angle. The OLED display panel is expected to become a next generation flat panel display technology after the LCD, and is one of the most popular flat panel display technologies at present.

SUMMARY

Embodiments of the present application provide a pixel arrangement structure, a mask component, and a display panel.

Embodiments of a first aspect of the present application provide a pixel arrangement structure including a plurality of pixel units arranged in rows and columns along a first direction and a second direction, wherein each of the pixel units includes: a first pixel group, including a first sub-pixel and a second sub-pixel distributed along the first direction, wherein the first sub-pixel has a plurality of first opening sides, and the second sub-pixel has a plurality of second opening sides; a second pixel group positioned at a side of the first pixel group along the second direction, wherein the second pixel group includes two third sub-pixels distributed along the first direction, and one of the third sub-pixels is arranged between the first sub-pixel and the second sub-pixel, and each of the third sub-pixels has two third opening sides opposite to each other and two fourth opening sides opposite to each other, wherein the pixel units in two adjacent rows along the second direction are staggered, the first sub-pixels and second sub-pixels of the pixel units are arranged alternately along the second direction, two of the first sub-pixels and two of the second sub-pixels are arranged alternately around a periphery of the third sub-pixels, the two third opening sides each overlaps with one of the first opening sides of the two first sub-pixels, and the two fourth opening sides each overlaps with one of the second opening sides of the two second sub-pixels.

A second aspect of the present application provides a mask component, the mask component is configured to form, by evaporation, the pixel arrangement structure according to any one the embodiments of the first aspect, and the mask component includes: a first mask plate including a first mask opening adapted to the first sub-pixel; a second mask plate including a second mask opening adapted to the second sub-pixel; and a third mask plate including a third mask opening adapted to the third sub-pixel.

A third aspect of the present application provides a display panel including the pixel arrangement structure according to any one the embodiments of the first aspect.

BRIEF DESCRIPTION OF THE DRAWINGS

Other features, objects and advantages of the present application will become more apparent from reading the following detailed description of the non-limiting embodiments with reference to the accompanying drawings, in which the same or similar reference numerals represent the same or similar features.

DETAILED DESCRIPTION

Figure 1:
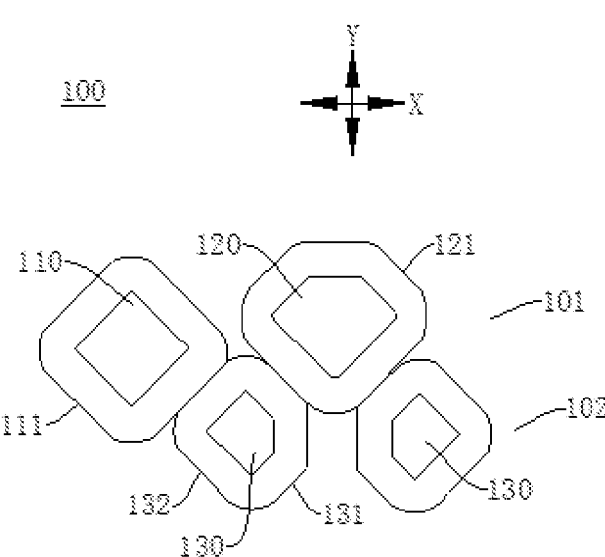
FIG. 1 is a schematic structural view of a pixel unit in a pixel arrangement structure according to an embodiment of a first aspect of the present application.

Features and exemplary embodiments of various aspects of the present application will be described in detail below. Numerous specific details are set forth in the following detailed description to provide a thorough understanding of the present application. However, it will be apparent to a person skilled in the art that the present application may be practiced without some of these specific details. The following description of the embodiments is merely to provide a better understanding of the present application by illustrating examples of the present application. In the drawings and the following description, at least some of well-known structures and techniques have not been shown to avoid unnecessary obscurity of the present application. In addition, size of some structures may be exaggerated for clarity. Furthermore, the features, structures, or characteristics described below may be combined in one or more embodiments by any suitable manner.

In order to better understand the present application, a pixel arrangement structure, a mask component, a display panel, and an electronic device according to the embodiments of the present application will be described in detail with reference to FIG. 1 to FIG. 11.

Figure 2:
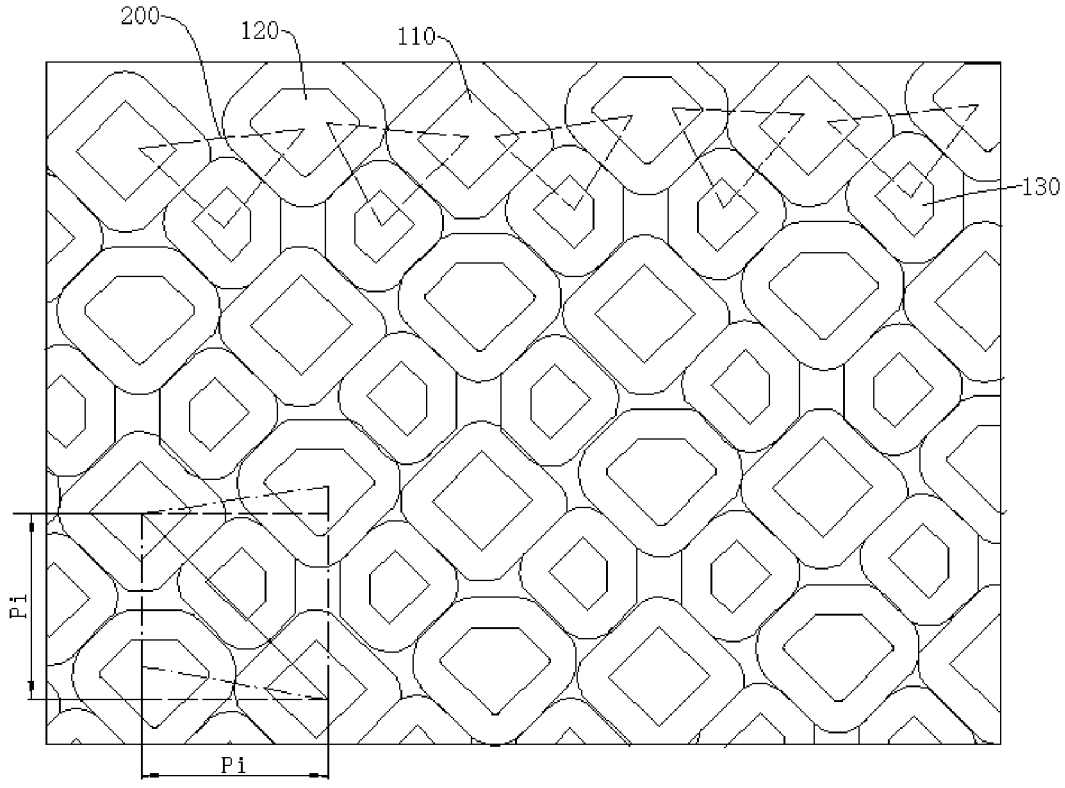
FIG. 2 is a schematic structural view of a pixel arrangement structure according to an embodiment of a first aspect of the present application.

With reference to FIG. 1 and FIG. 2, FIG. 1 is a schematic structural view of a pixel unit 100 in a pixel arrangement structure according to an embodiment of the present application, and FIG. 2 is a schematic structural view of a pixel arrangement structure according to an embodiment of the present application.

The pixel arrangement structure according to the embodiments of the present application includes a plurality of sub-pixels, the plurality of sub-pixels are combined to form the pixel unit 100, and the pixel unit 100 is shifted in a repeated manner to form the pixel arrangement structure. The sub-pixels include, for example, a first sub-pixel 110, a second sub-pixel 120, and third sub-pixels 130.

In some embodiments, the pixel arrangement structure includes a plurality of pixel units 100 arranged in rows and columns along a first direction and a second direction, and each of the pixel units 100 includes: a first pixel group 101, including a first sub-pixel 110 and a second sub-pixel 120 distributed along the first direction, wherein the first sub-pixel 110 has a plurality of first opening sides 111, and the second sub-pixel 120 has a plurality of second opening sides 121; a second pixel group 102 positioned at a side of the first pixel group 101 along the second direction, wherein the second pixel group 102 includes two third sub-pixels 130 distributed along the first direction, and one of the third sub-pixels 130 is arranged between the first sub-pixel 110 and the second sub-pixel 120, and each of the third sub-pixels 130 has two third opening sides 131 opposite to each other and two fourth opening sides 132 opposite to each other, wherein two adjacent rows of the pixel units 100 along the second direction are staggered, first sub-pixels 110 and second sub-pixels 120 are arranged alternately along the second direction, two of the first sub-pixels 110 and two of the second sub-pixels 120 are arranged alternately around a periphery of the third sub-pixels 130, the two third opening sides 131 each overlaps with one of the first opening sides 111 of two first sub-pixels 110, and the two fourth opening sides 132 each overlaps with one of the second opening sides 121 of two second sub-pixels 120.

The first direction and the second direction may be arranged in various manners, and the first direction and the second direction may intersect at any preset angle. In some optional embodiments, as shown in FIG. 1, an angle between the first direction (an X axis) and the second direction (a Y axis) is 90 degrees, so that the first sub-pixels 110, the second sub-pixels 120 and the third sub-pixels 130 may be arranged horizontally along a horizontal direction and vertically along a vertical direction, the structure is simple, and the manufacturing is easy.

In the pixel arrangement structure according to the present application, the pixel arrangement structure includes the pixel units 100, and each of the pixel units 100 includes a first pixel group 101 and a second pixel group 102. Two of the first sub-pixels 110 and two of the second sub-pixels 120 are arranged alternately around the periphery of the third sub-pixels 130, and a spacing among the first sub-pixel 110, the second sub-pixel 120 and the third sub-pixels 130 can be reduced, so that adjacent first sub-pixel 110, second sub-pixel 120 and third sub-pixel 130 which generate white light are closer to each other, thereby improving a display effect. In addition, the first sub-pixel 110, the second sub-pixel 120 and the third sub-pixel 130 are prevented from forming obvious display stripes along the first direction, thereby further improving the display effect.

In the embodiments of the present application, the two third opening sides 131 each overlaps with one of the first opening sides 111 of two first sub-pixels 110, and the two fourth opening sides 132 each overlaps with one of the second opening sides 121 of two second sub-pixels 120. Under a condition that the first sub-pixel 110, the second sub-pixel 120 and the third sub-pixels 130 are formed in sequence by evaporation using different mask plates, a side of a mask opening for evaporating the first sub-pixel 110 overlaps with a side of a mask opening for evaporating the third sub-pixels 130. On the one hand, a side of a light-emitting material of the first sub-pixel 110 formed by evaporation does not overlap with a side of a light-emitting material of the third sub-pixel 130 formed by evaporation, thereby preventing crosstalk in color. On the other hand, the spacing among the first sub-pixel 110, the second sub-pixel 120 and the third sub-pixels 130 can be further reduced to improve a pixel aperture ratio and the display effect.

Each of the sub-pixels includes a light-emitting material region and a pixel region positioned in the light-emitting material region. The light-emitting material region is a region corresponding to a mask opening on a mask plate under a condition that the sub-pixels are formed by evaporation using the mask plate, that is, a size of the light-emitting material region is equal to a size of the mask opening, and the light-emitting material is evaporated in the light-emitting material region. The pixel region is a size of a pixel opening on a pixel definition layer, and the pixel region corresponds to a pixel electrode of the display panel. In a process that the display panel emits light, the pixel electrode drives the light-emitting material in the pixel region to emit light, that is, an overlapping part of the light-emitting material region and the pixel region emits light. The light-emitting material region and the pixel region are similar in shape, a center of the light-emitting material region overlaps with a center of the pixel region, and minimum distances from different positions on sides of the light-emitting material region to different positions on sides of the pixel region are equal within an error range. The light-emitting material region has opening sides, and the pixel region has pixel sides.

The two third opening sides 131 each overlaps with one of the first opening sides 111 of two first sub-pixels 110: the expression "overlaps with" herein is not a complete overlap in the mathematical geometrical sense, instead, as long as a distance between a third opening side 131 and a first opening side 111 of the first sub-pixel 110 adjacent to the third opening side 131 is within an error range. For example, the distance between the third opening side 131 and the first opening side 111 of the first sub-pixel 110 adjacent to the third opening side 131 is sufficiently small, and in a process of a pixel evaporation, one of sides of a mask opening for evaporating the first sub-pixel 110 and one of sides of a mask opening for evaporating the third sub-pixel 130 may be referred to a same line. For example, under a condition that the distance between the third opening side 131 and the first opening side 111 of the first sub-pixel 110 adjacent to the third opening side 131 is less than or equal to 0.1 μm, the third opening side 131 may be considered to overlap with the first opening side 111.

The two fourth opening sides 132 each overlaps with one of the second opening sides 121 of two second sub-pixels 120, in which the expression "overlaps with" means that a distance between a fourth opening side 132 and a second opening side 121 of the second sub-pixel 120 adjacent to the fourth opening side 132 is within the error range. For example, under a condition that the distance between the fourth opening side 132 and the second opening side 121 of the second sub-pixel 120 adjacent to the fourth opening side 132 is less than or equal to 0.1 μm, the fourth opening side 132 may be considered to overlap with the second opening side 121.

Figure 3:
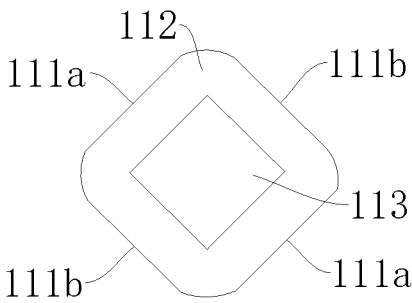
FIG. 3 is a schematic structural view of a first sub-pixel of a pixel arrangement structure according to an embodiment of a first aspect of the present application.
Figure 4:
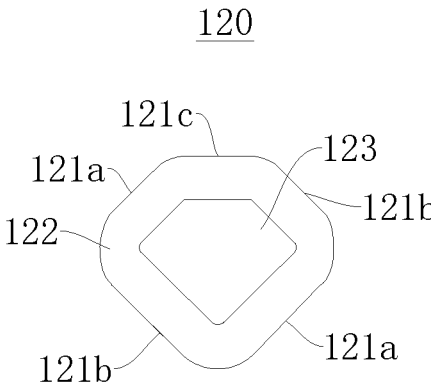
FIG. 4 is a schematic structural view of a second sub-pixel of a pixel arrangement structure according to an embodiment of a first aspect of the present application.
Figure 5:
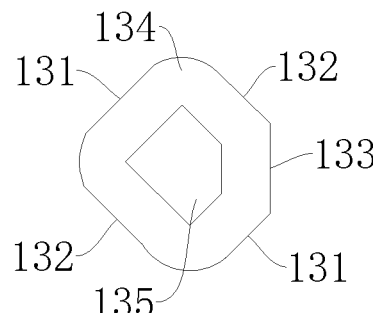
FIG. 5 is a schematic structural view of a third sub-pixel of a pixel arrangement structure according to an embodiment of a first aspect of the present application.

With reference to FIG. 3 to FIG. 5, FIG. 3 is a schematic structural view of a first sub-pixel 110 of a pixel arrangement structure according to an embodiment of a first aspect of the present application; FIG. 4 is a schematic structural view of a second sub-pixel 120 of a pixel arrangement structure according to an embodiment of a first aspect of the present application; FIG. 5 is a schematic structural view of a third sub-pixel 130 of a pixel arrangement structure according to an embodiment of a first aspect of the present application.

The first sub-pixel 110 has a first light-emitting material region 112 and a first pixel region 113, the first light-emitting material region 112 has a plurality of first opening sides 111, and the first opening sides 111 include first sub-opening sides 111*a* and second sub-opening sides 111*b*. Optionally, the first sub-opening sides 111*a* and the second sub-opening sides 111*b* may be connected to each other at preset angles, or the first sub-opening sides 111*a* and the second sub-opening sides 111*b* may be connected to each other through smooth transition. Sides of the first pixel region 113 may be connected to each other at preset angles, or the sides of the first pixel region 113 may be connected to each other through smooth transition.

The second sub-pixel 120 has a second light-emitting material region 122 and a second pixel region 123, the second light-emitting material region 122 has a plurality of second opening sides 121, and the second opening sides 121 include third sub-opening sides 121*a* and fourth sub-opening sides 121*b*. In some optional embodiments, the second opening sides 121 further include a first chamfered side 121*c*. Optionally, the third sub-opening sides 121*a* and the fourth sub-opening sides 121*b* may be connected to each other at preset angles, or the third sub-opening sides 121*a* and the fourth sub-opening sides 121*b* may be connected to each other through smooth transition. Sides of the second pixel region 123 may be connected to each other at preset angles, or the sides of the second pixel region 123 may be connected to each other through smooth transition.

The third sub-pixel 130 has a third light-emitting material region 134 and a third pixel region 135, and the third light-emitting material region 134 has third opening sides 131 and fourth opening sides 132. In some optional embodiments, the third light-emitting material region 134 further has a second chamfered side 133. Optionally, the third opening sides 131 and the fourth opening sides 132 may be connected to each other at preset angles, or the third opening sides 131 and the fourth opening sides 132 may be connected to each other through smooth transition. Sides of the third pixel region 135 may be connected to each other at preset angles, or the sides of the third pixel region 135 may be connected to each other through smooth transition.

The plurality of second opening sides 121 of the second sub-pixel 120 are sides of a light-emitting material region of the second sub-pixel 120. The plurality of first opening sides 111 of the first sub-pixel 110 are sides of a light-emitting material region of the first sub-pixel 110. The third opening sides 131 and the fourth opening sides 132 of the third sub-pixel 130 are sides of a light-emitting material region of the third sub-pixel 130.

The first sub-pixel 110, the second sub-pixel 120 and the third sub-pixel 130 form a pixel display unit 200 capable of displaying white light. The pixel display unit 200 is shown in FIG. 2 as a dotted triangle, which does not constitute a structural limitation on the pixel arrangement structure of the embodiments of the present application.

In the pixel arrangement structure according to the present application, in the pixel unit 100, a ratio of numbers of the first sub-pixel 110, the second sub-pixel 120 in the first pixel group 101 and the third sub-pixels 130 in the second pixel group 102 is 1:1:2. Under a condition that the pixel units 100 are arranged in sequence along the first direction, the first sub-pixels 110 and the second sub-pixels 120 in the first pixel groups 101 may be shared by two adjacent pixel display units along the first direction, so that a number of pixel display units 200 formed in the pixel arrangement structure can be increased, and a greater pixel resolution can be achieved by using fewer sub-pixels, thereby improving the display effect of the pixel arrangement structure.

In some optional embodiments, the first sub-pixel 110 is a red sub-pixel, the second sub-pixel 120 is a blue sub-pixel, and the third sub-pixel 130 is a green sub-pixel. Alternatively, the first sub-pixel 110 is a blue sub-pixel, the second sub-pixel 120 is a red sub-pixel, and the third sub-pixel 130 is a green sub-pixel.

A human eye is more sensitive to green. In these optional embodiments, a greater number of green sub-pixels are used, but the green sub-pixels are not shared, and each of the pixel display units 200 includes one complete green sub-pixel, so as to ensure that display of green is not distorted, thereby improving the comfort level of the human eye when viewing.

The third sub-pixel 130 may be in various shapes. Optionally, as shown in FIG. 5, the two third opening sides 131 are arranged in parallel, and the two fourth opening sides 132 are arranged in parallel.

In these optional embodiments, under a condition that the two third opening sides 131 are arranged in parallel, the first opening sides 111 of the two first sub-pixels 110 which overlap with the two third opening sides 131 and which are positioned around the periphery of the third sub-pixel 130 are arranged in parallel. Under a condition that the two fourth opening sides 132 are arranged in parallel, the second opening sides 121 of the two second sub-pixels 120 which overlap with the two fourth opening sides 132 and which are positioned around the periphery of the third sub-pixel 130 are arranged in parallel. The spacing among the first sub-pixel 110, the second sub-pixel 120 and the third sub-pixel 130 can be further reduced to improve a pixel aperture ratio and the display effect.

Optionally, as shown in FIG. 5, an angle formed by the third opening side 131 and the fourth opening side 132 is 90 degrees, so that the first sub-pixel 110, the second sub-pixel 120 and the third sub-pixel 130 are arranged more evenly.

In some optional embodiments, as shown in FIG. 5, the third sub-pixel 130 is a pentagon in shape, the third sub-pixel 130 further includes a second chamfered side 133 connecting one of the third opening sides 131 to one of the fourth opening sides 132, and the second chamfered side 133 extends along the second direction.

In these optional embodiments, the third sub-pixel 130 has the second chamfered side 133, and the second chamfered side 133 extends along the second direction, so that a size of the third sub-pixel 130 can be reduced, a spacing between the two third sub-pixels 130 in the pixel unit 100 and a spacing between mask openings of the mask plate for evaporating the third sub-pixel 130 increase, so as to improve structural strength of the mask plate for evaporating the third sub-pixel 130, thereby improving evaporation accuracy of the third sub-pixel 130.

In some optional embodiments, the two third sub-pixels 130 in the pixel unit 100 are symmetrically distributed with respect to an axis extending along the second direction. The spacing between the two third sub-pixels 130 in the pixel unit 100 can be further reduced, so as to improve the structural strength of the mask plate for evaporating the third sub-pixel 130, thereby improving the evaporation accuracy of the third sub-pixel 130.

Optionally, with reference to FIG. 1 and FIG. 5, in the pixel unit 100, the first sub-pixel 110 and/or the second sub-pixel 120 is arranged between adjacent third sub-pixels 130 and positioned at a side of the third sub-pixel 130 along the first direction, and an axis passes through a center of the second sub-pixel 120 and/or the first sub-pixel 110. Under a condition that the axis passes through the center of the first sub-pixel 110 and/or the second sub-pixel 120, a plurality of sub-pixels in the pixel arrangement structure are arranged more evenly, and the pixel arrangement structure displays color more evenly. Optionally, the axis passes through the center of the first sub-pixel 110 and the second sub-pixel 120.

Figure 6:
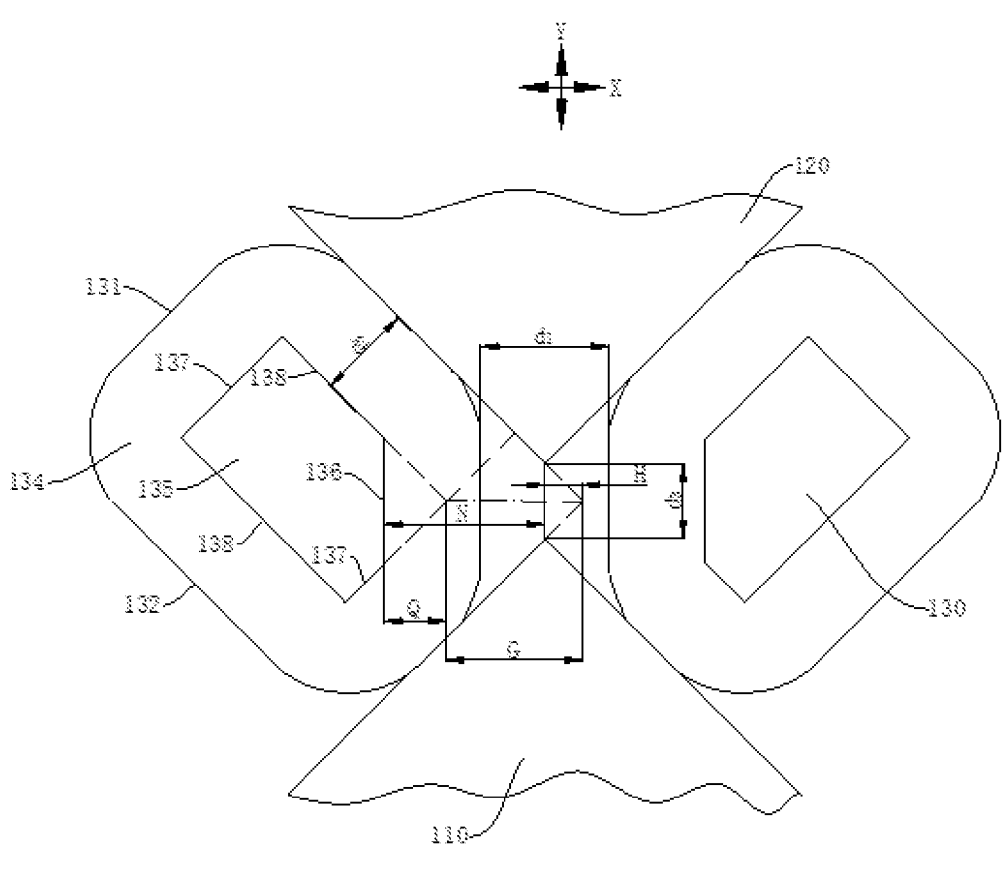
FIG. 6 is a partial schematic structural view of a pixel arrangement structure according to an embodiment of a first aspect of the present application.

With reference to FIG. 6, which is a partial schematic structural view of a pixel arrangement structure according to an embodiment of a first aspect of the present application.

In some optional embodiments, each of the third sub-pixels 130 includes a third light-emitting material region 134 and a third pixel region 135 positioned in the third light-emitting material region 134, and the third opening sides 131 and the fourth opening sides 132 are sides of the third light-emitting material region 134; the third pixel region 135 includes two third pixel sides 137 arranged in parallel with the third opening sides 131, two fourth pixel sides 138 arranged in parallel with the fourth opening sides 132, and a second pixel chamfered side 136 arranged in parallel with the second chamfered side 133, extending lines of the third pixel side 137 and the fourth pixel side 138 at two ends of the second pixel chamfered side 136 form a virtual pixel angle;

As shown in FIG. 6, a distance Q between the second pixel chamfered side 136 and the virtual pixel angle satisfies the following relationship:

$$Q = N - (G - H) \qquad (2)$$

wherein N is equal to a sum of half of a first spacing $d_1$ between third light-emitting material regions 134 of the two third sub-pixels 130 in two adjacent pixel units 100 along the first direction and a second spacing $d_2$ between a side of the third light-emitting material region 134 and a side of the third pixel region 135 in a same third sub-pixel 130, that is, $N=d_1/2+d_2$.

G satisfies the following relationship:

$$G = \sqrt{d_2^2 + d_2^2} = \sqrt{2}\, d_2 \qquad (3)$$

H satisfies the following relationship:

$$H = \frac{d_3}{2} \qquad (4)$$

In conclusion, the equation (3) and the equation (4) are taken into the equation (2), then it can be obtained that Q satisfies the following relationship:

$$Q = \left(\frac{d_1}{2} + d_2\right) - \left[\sqrt{2}\, d_2 - \frac{d_3}{2}\right] \qquad (1)$$

wherein $d_1$ is the first spacing between third light-emitting material regions 134 of the two third sub-pixels 130 in the pixel unit 100 along the first direction, $d_2$ is the second spacing between a side of the third light-emitting material region 134 and a side of the third pixel region 135 in a same third sub-pixel 130, and $d_3$ is a third spacing between the first sub-pixel 110 and the second sub-pixel 120 in different pixel units 100 positioned between the two third sub-pixels 130 in the same the pixel unit 100 and arranged along the second direction. In these optional embodiments, a size of a chamfer of the third sub-pixel 130 may be determined according to the equation (1).

In some optional embodiments, with further reference to FIG. 2, the pixel arrangement structure includes a virtual quadrilateral, centers of two first sub-pixels 110 and centers of two second sub-pixels 120 are respectively positioned at four vertices of the virtual quadrilateral, and one single third sub-pixel 130 is positioned in the virtual quadrilateral. A position where the virtual quadrilateral is arranged and a size of the virtual quadrilateral are shown in dotted lines in FIG. 2, and the dotted lines do not constitute a structural limitation on the pixel arrangement structure of the embodiments of the present application. In the embodiment, the virtual quadrilateral is an isosceles trapezoid in shape, and in other embodiments, the virtual quadrilateral may be a quadrilateral in other shapes. In the embodiment, the virtual quadrilateral has diagonals, and a virtual square, whose diagonals are diagonals of the virtual quadrilateral, is formed. It is assumed that a side length of the virtual square is Pi, a length of a diagonal of the virtual square is $\sqrt{2}$Pi, that is, a length of the diagonal of the virtual quadrilateral in the present embodiment is $\sqrt{2}$Pi. In this embodiment, Pi is a pixel size, that is, the pixel size is a side length of the virtual square. Then the size of the third sub-pixel 130 may be determined according to a size of the first sub-pixel 110, a size of the second sub-pixel 120 and the pixel size.

Specifically, in a same third sub-pixel 130, $H_1$ is a spacing between the two third opening sides 131, and $H_1=\sqrt{2}$Pi$-$a wherein Pi is a pixel size, that is, Pi is the side length of the virtual square, and a is a size of the first sub-pixel 110 along an extending direction of the fourth opening side 132; and/or $H_2$ is a spacing between the two fourth opening sides 132, and $H_2=\sqrt{2}$Pi$-$b, wherein Pi is a pixel size, that is, Pi is the side length of the virtual square, and b is a size of the second sub-pixel 120 along an extending direction of the third opening side 131.

Under a condition that the spacing $H_1$ between the two third opening sides 131 is equal to $\sqrt{2}$Pi$-$a, the two first sub-pixels 110 positioned around the periphery of the third sub-pixel 130 are arranged symmetrically with respect to the third sub-pixel 130, and distances from the two first sub-pixels 110 positioned around the periphery of the third sub-pixel 130 to the third sub-pixel 130 are equal, so that a plurality of first sub-pixels 110 are arranged more evenly.

Under a condition that the spacing $H_2$ between the two fourth opening sides 132 is equal to $\sqrt{2}Pi{-}b$, the two second sub-pixels 120 positioned around the periphery of the third sub-pixel 130 are arranged symmetrically with respect to the third sub-pixel 130, and distances from the two second sub-pixels 120 positioned around the periphery of the third sub-pixel 130 to the third sub-pixel 130 are equal, so that a plurality of second sub-pixels 120 are arranged more evenly.

Figure 7:
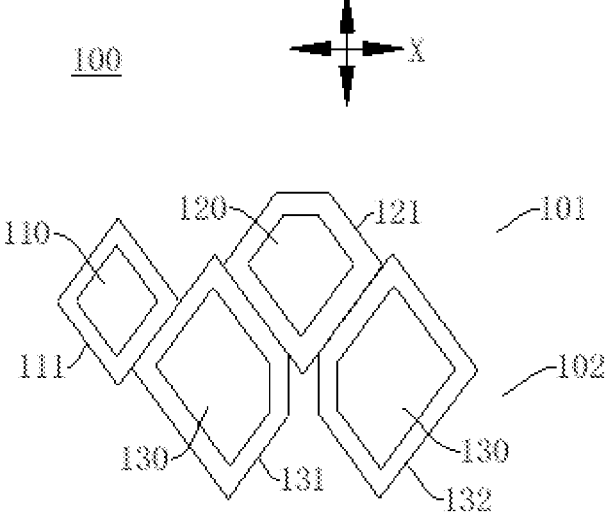
FIG. 7 is a schematic structural view of a pixel unit in a pixel arrangement structure according to another embodiment of a first aspect of the present application.
Figure 8:
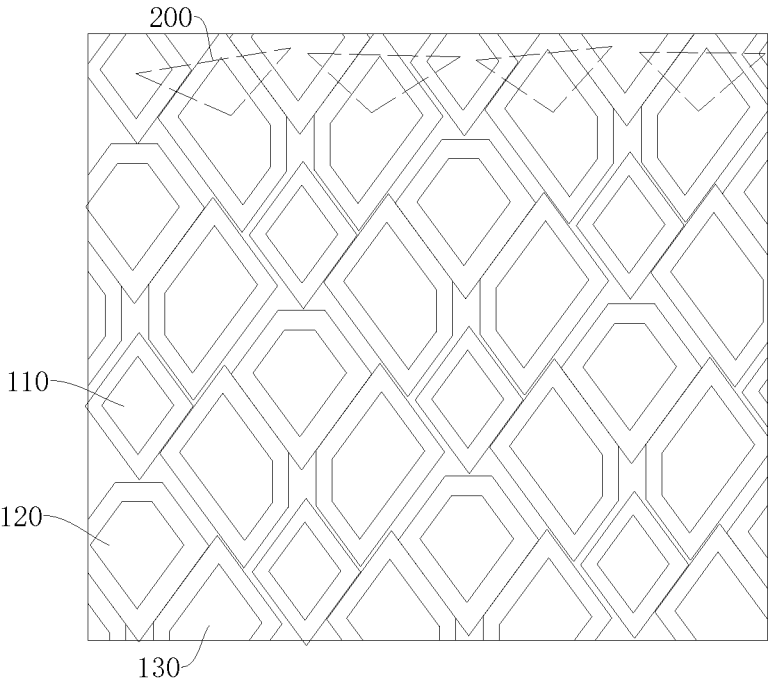
FIG. 8 is a schematic structural view of a pixel arrangement structure according to another embodiment of a first aspect of the present application.

With reference to FIG. 7 and FIG. 8, FIG. 7 is a schematic structural view of a pixel unit 100 in a pixel arrangement structure according to another embodiment of a first aspect of the present application; FIG. 8 is a schematic structural view of a pixel arrangement structure according to another embodiment of a first aspect of the present application.

The first sub-pixel 110 may be in various shapes. In some optional embodiments, the first sub-pixel 110 is a parallelogram in shape, the plurality of first opening sides 111 include two parallel first sub-opening sides 111a and two parallel second sub-opening sides 111b, and the first sub-opening sides 111a and the second sub-opening sides 111b are connected to each other to form vertex angles; the second sub-pixel 120 is a pentagon in shape, the plurality of the second opening sides 121 include two parallel third sub-opening sides 121a, two parallel fourth sub-opening sides 121b, and a first chamfered side 121c connecting one of the third sub-opening sides 121a to one of the fourth sub-opening sides 121b; one of the vertex angles of the first sub-pixel 110 in an $i^{th}$ row is propped against the first chamfered side 121c of the second sub-pixel 120 in an $(i+1)^{th}$ row.

In these optional embodiments, the second sub-pixel 120 is a pentagon in shape, and one of the vertex angles of the first sub-pixel 110 in the $i^{th}$ row is propped against the first chamfered side 121c of the second sub-pixel 120 in the $(i+1)^{th}$ row, so that a spacing between the first sub-pixel 110 in the $i^{th}$ row and the second sub-pixel 120 in the $(i+1)^{th}$ row can be reduced, and the first sub-pixel 110 in the $i^{th}$ row can be prevented from overlapping with the second sub-pixel 120 in the $(i+1)^{th}$ row, and meanwhile improving the pixel aperture ratio.

Optionally, angles between the first sub-opening sides 111a and the second sub-opening sides 111b are equal to corresponding angles between the third sub-opening sides 121a and the fourth sub-opening sides 121b.

For example, "corresponding" means that: the two first sub-opening sides 111a and the two second sub-opening sides 111b of the first sub-pixel 110 form four vertex angles, the four vertex angles include two first vertex angles and two second vertex angles, the two first vertex angles are distributed along the second direction, and the two second vertex angles are distributed along the first direction. The two third sub-opening sides 121a and the two fourth sub-opening sides 121b of the second sub-pixel 120 form four vertex angles, the four vertex angles include two third vertex angles and two fourth vertex angles, the two third vertex angles are distributed along the second direction, and the two fourth vertex angles are distributed along the first direction. The first vertex angle is equal to the third vertex angle, and the second vertex angle is equal to the fourth vertex angle.

Optionally, the first vertex angle may be less than the second vertex angle, for example, the first vertex angle is an acute angle, and the second vertex angle is an obtuse angle. Optionally, the first vertex angle may be equal to the second vertex angle, and the first vertex angle and the second vertex angle are both a right angle.

In these optional embodiments, under a condition that the first vertex angle is equal to the third vertex angle, and the second vertex angle is equal to the fourth vertex angle, a size of a first sub-pixel 110 and a size of a second sub-pixel 120 along the first direction and the second direction are approximate, and under a condition that the first sub-pixels 110 and the second sub-pixels 120 are arranged in an array along the first direction and the second direction, a spacing between the first sub-pixel 110 and the second sub-pixel 120 can be reduced, thereby improving the pixel aperture ratio.

Optionally, an angle between the first sub-opening sides 111a and the second sub-opening sides 111b, a corresponding angle between the third sub-opening sides 121a and the fourth sub-opening sides 121b, and a corresponding angle between the third opening sides 131 and the fourth opening sides 132 are equal to each other.

For example, the third sub-pixel 130 includes four vertex angles, two of the four vertex angles are fifth vertex angles distributed along the second direction, and two of the four vertex angles are sixth vertex angles distributed along the first direction, the first vertex angle, the third vertex angle and the fifth vertex angle are equal, and the second vertex angle, the fourth vertex angle and the sixth vertex angle are equal.

In these optional embodiments, the sub-pixels are arranged more evenly, and the spacing among the first sub-pixel 110, the second sub-pixel 120 and the third sub-pixel 130 can be reduced, thereby increasing the pixel aperture ratio.

Optionally, the spacing between the two third opening sides 131 is greater than the spacing between the two fourth opening sides 132, and a second sub-pixel 120 in the $i^{th}$ row and a first sub-pixel 110 in the $(i+1)^{th}$ row are arranged at an interval along the second direction.

In these optional embodiments, the first sub-pixel 110 in the $i^{th}$ row is propped against the second sub-pixel 120 in the $(i+1)^{th}$ row, and the second sub-pixel 120 in the $i^{th}$ row and the first sub-pixel 110 in the $(i+1)^{th}$ row are distributed at an interval, so that lines connecting the centers of the two first sub-pixels 110 and the centers of the two second sub-pixels 120 (the two first sub-pixels 110 and the two second sub-pixels 120 are arranged around the periphery of the third sub-pixels 130) is a trapezoid in shape.

In some optional embodiments, as shown in FIG. 1, the first sub-pixel 110 is a rectangle in shape, and an included angle between the third sub-opening side 121a and the fourth sub-opening side 121b in the second sub-pixel 120 is 90 degrees, areas of the first sub-pixel 110 and the second sub-pixel 120 can be increased, so that the first sub-pixels 110 and the second sub-pixels 120 are distributed more evenly in the pixel arrangement structure.

Optionally, as shown in FIG. 1 to FIG. 5, the first sub-pixel 110 is a square in shape, and the third sub-opening side 121a and the fourth sub-opening side 121b connected to each other in the second sub-pixel 120 have a same length, the areas of the first sub-pixel 110 and the second sub-pixel 120 can be further increased, so that the first sub-pixels 110 and the second sub-pixels 120 are distributed more evenly in the pixel arrangement structure.

Optionally, as shown in FIG. 1 and FIG. 4, the first chamfered side 121c extends along the first direction, and one of the vertex angles of the first sub-pixel 110 in the $i^{th}$ row corresponds to a middle of the first chamfered side 121c of the second sub-pixel 120 in the (i+1)$^{th}$ row. The first sub-pixel 110 and the second sub-pixel 120 are arranged more correspondingly along the second direction, and the first sub-pixel 110 and the second sub-pixel 120 are distributed more evenly in the pixel arrangement structure.

Optionally, the first sub-pixel 110 has a second diagonal extending along the second direction, and the second diagonal of the first sub-pixel 110 in the i$^{th}$ row is perpendicular to the first chamfered side 121*c* of the second sub-pixel 120 in the (i+1)$^{th}$ row.

Optionally, a length of the first sub-opening side 111*a* is equal to lengths of interconnected third sub-opening side 121*a* and fourth sub-opening side 121*b*, and a length of the second sub-opening side 111*b* is equal to lengths of interconnected third sub-opening side 121*a* and fourth sub-opening side 121*b*. In these optional embodiments, the areas of the first sub-pixel 110 and the second sub-pixel 120 which are shared are approximate to ensure that the pixel arrangement structure displays color evenly.

Further, in some optional embodiments, an area of a first sub-pixel 110 is greater than an area of a third sub-pixel 130; and/or, an area of the second sub-pixel 120 is greater than an area of a third sub-pixel 130.

In these optional embodiments, an area of sub-pixels which are shared is greater than an area of sub-pixels which are not shared, thereby ensuring the display effect of the pixel arrangement structure. Since the sub-pixels which are shared are required to display when two pixel display units 200 formed by the sub-pixels display, display times of the sub-pixels which are shared are greater than display times of the sub-pixels which are not shared, and the area of the sub-pixels which are shared is greater, a lifespan of the sub-pixels which are shared can be increased, thereby increasing a lifespan of the whole pixel arrangement structure.

Optionally, the first sub-pixels 110 are arranged symmetrically with respect to a first axis extending along the second direction, and the first axis passes through centers of the first sub-pixels 110; and/or, the second sub-pixels 120 are arranged symmetrically with respect to a second axis extending along the second direction, and the second axis passes through centers of the second sub-pixels 120.

In some optional embodiments, the first sub-pixel 110 is provided correspondingly with two first anode blocks insulated from each other, and the two first anode blocks are arranged side by side along the first direction.

In these optional embodiments, the two first anode blocks are insulated from each other, so that the two first anode blocks can be controlled separately. The first sub-pixel 110 is shared by two adjacent pixel display units 200 along the first direction, and under a condition that only one of the two adjacent pixel display units 200 is required to display, a corresponding first anode block may be controlled to operate, so that a corresponding part of the first sub-pixel 110 emits light, and another part of the first sub-pixel 110 which is not required to display does not emit light, thereby improving the display accuracy.

In some optional embodiments, the second sub-pixel 120 is provided correspondingly with two second anode blocks insulated from each other, and the two second anode blocks are arranged side by side along the first direction.

In these optional embodiments, the second sub-pixel 120 is shared by two adjacent pixel display units 200 along the first direction, and under a condition that only one of the two adjacent pixel display units 200 is required to display, a corresponding second anode block may be controlled to operate, so that a corresponding part of the second sub-pixel

120 emits light, and another part of the second sub-pixel 120 which is not required to display does not emit light, thereby improving the display accuracy.

A second embodiment of the present application further provides a display panel including the pixel arrangement structure of any one of the above first embodiments. Since the display panel according to the embodiments of the present application includes the pixel arrangement structure of any one of the above first embodiments, the display panel according to the present application has the beneficial effects of the pixel arrangement structure in any one of the above first embodiments, which will not be repeated here.

In some optional embodiments, the display panel includes a display region AA and a non-display region NA arranged around the display region AA. In other embodiments, the display panel may include only the display region AA and do not include the non-display region NA. It may be seen after the display area AA is partially enlarged that the above pixel arrangement structure is used by the display panel.

An embodiment of a third aspect according to the present application further provides an electronic device including the above display panel. Since the electronic device according to the embodiment of the present application includes the above display panel, the electronic device has the beneficial effects of the above display panel, which will not be described in detail here.

Types of the electronic device is not limited here, and the electronic device may be a mobile terminal, a display, and the like.

Figure 9:
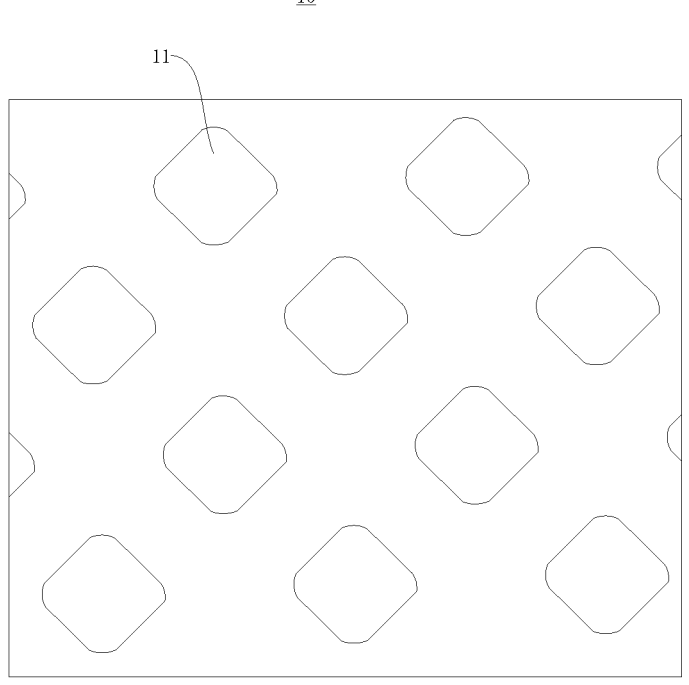
FIG. 9 is a schematic structural view of a first mask plate of a mask component according to an embodiment of a fourth aspect of the present application.
Figure 10:
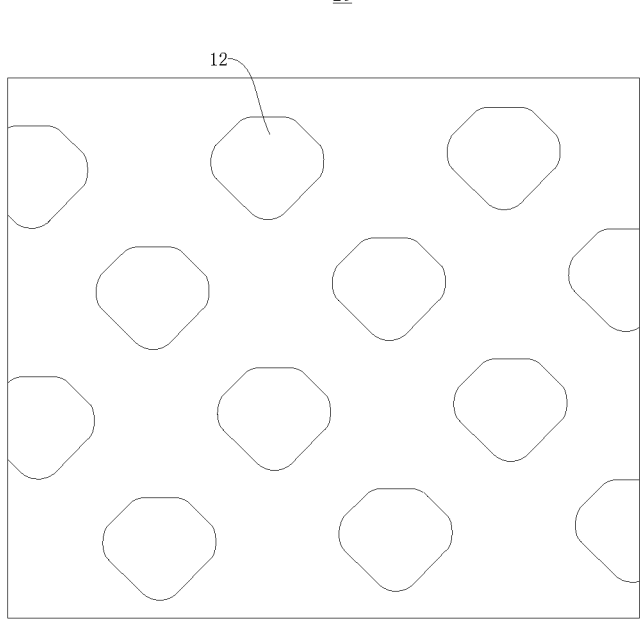
FIG. 10 is a schematic structural view of a second mask plate of a mask component according to an embodiment of a fourth aspect of the present application.
Figure 11:
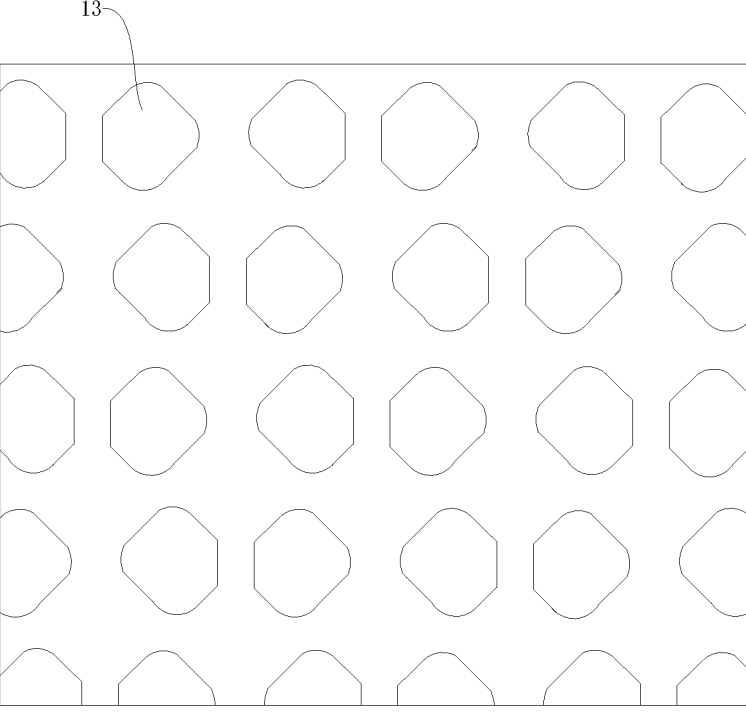
FIG. 11 is a schematic structural view of a third mask plate of a mask component according to an embodiment of a fourth aspect of the present application.

As shown in FIG. 9 to FIG. 11, FIG. 9 is a schematic structural view of a first mask plate 10 of a mask component according to an embodiment of a fourth aspect of the present application; FIG. 10 is a schematic structural view of a second mask plate 20 of a mask component according to an embodiment of a fourth aspect of the present application; FIG. 11 is a schematic structural view of a third mask plate of a mask component according to an embodiment of a fourth aspect of the present application.

The embodiment of the fourth aspect of the present application further provides a mask component including the first mask plate 10, the second mask plate 20 and a third mask plate 30; the first mask plate 10 includes a first mask opening 11 adapted to the first sub-pixel 110, the second mask plate 20 includes a second mask opening 21 adapted to the second sub-pixel 120, and the third mask plate 30 includes a third mask opening 31 adapted to the third sub-pixel 130. The pixel arrangement structure of any one of the embodiments of the first aspect may be formed by evaporation using the mask component of the present application.

The present application may be implemented in other specific forms without departing from the spirit and essential characteristics thereof. For example, the algorithms described in specific embodiments may be modified, while system architecture does not depart from the basic spirit of the present application. Accordingly, the embodiments are considered in all respects as illustrative and not restrictive. The scope of the present application is defined by the appended claims rather than by the above description, and all changes falling within the scope of connotations and equivalents of the claims are therefore included in the scope of the present application.

What is claimed is:

1. A pixel arrangement structure, comprising a plurality of pixel units arranged in rows and columns along a first direction and a second direction, wherein each of the pixel units comprises:

a first pixel group, comprising a first sub-pixel and a second sub-pixel distributed along the first direction, wherein the first sub-pixel has a first light-emitting material region and a first pixel region positioned in the first light-emitting material region, the first light-emitting material region has a plurality of first opening sides, the first sub-pixel is a parallelogram in shape, the plurality of first opening sides comprise two parallel first sub-opening sides and two parallel second sub-opening sides, and the first sub-opening sides and the second sub-opening sides are connected to each other to form vertex angles; the second sub-pixel has a second light-emitting material region and a second pixel region positioned in the second light-emitting material region, the second light-emitting material region has a plurality of second opening sides, the second sub-pixel is a pentagon in shape, the plurality of the second opening sides comprise two parallel third sub-opening sides, two parallel fourth sub-opening sides, and one first chamfered side connecting one of the third sub-opening sides to one of the fourth sub-opening sides; and one of the vertex angles of the first sub-pixel in an $i^{th}$ row is propped against the first chamfered side of the second sub-pixel in an $(i+1)^{th}$ row;

a second pixel group positioned at a side of the first pixel group along the second direction, wherein the second pixel group comprises two third sub-pixels distributed along the first direction, and one of the third sub-pixels is arranged between the first sub-pixel and the second sub-pixel, and each of the third sub-pixels has two third opening sides opposite to each other and two fourth opening sides opposite to each other, wherein the pixel units in two adjacent rows along the second direction are staggered, the first sub-pixels and second sub-pixels of the pixel units are arranged alternately along the second direction, two of the first sub-pixels and two of the second sub-pixels are arranged alternately around a periphery of the third sub-pixels, the two third opening sides each overlaps with one of the first opening sides of the two first sub-pixels, and the two fourth opening sides each overlaps with one of the second opening sides of the two second sub-pixels.

2. The pixel arrangement structure according to claim 1, wherein a spacing between the two third opening sides is greater than a spacing between the two fourth opening sides, and the second sub-pixel in the $i^{th}$ row and the first sub-pixel in the $(i+1)^{th}$ row are arranged at an interval along the second direction.

3. The pixel arrangement structure according to claim 1, wherein the first sub-pixel is a rectangle in shape, and an angle between the third sub-opening side and the fourth sub-opening side is 90 degrees.

4. The pixel arrangement structure according to claim 3, wherein the first sub-pixel is a square in shape, and the third sub-opening side and the fourth sub-opening side connected to each other have a same length.

5. The pixel arrangement structure according to claim 1, wherein the first chamfered side extends along the first direction, and one of the vertex angles of the first sub-pixel in the $i^{th}$ row corresponds to a middle of the first chamfered side of the second sub-pixel in the $(i+1)^{th}$ row.

6. The pixel arrangement structure according to claim 1, wherein the first sub-pixel has a second diagonal extending along the second direction, and the second diagonal of the first sub-pixel in the $i^{th}$ row is perpendicular to the first chamfered side of the second sub-pixel in the $(i+1)^{th}$ row.

7. The pixel arrangement structure according to claim 1, wherein the two third opening sides are arranged in parallel, and the two fourth opening sides are arranged in parallel.

8. The pixel arrangement structure according to claim 7, wherein the third sub-pixel is a pentagon in shape, the third sub-pixel further comprises a second chamfered side connecting one of the third opening sides to one of the fourth opening sides, and the second chamfered side extends along the second direction.

9. The pixel arrangement structure according to claim 8, wherein the two third sub-pixels in the pixel unit are symmetrically distributed with respect to an axis extending along the second direction.

10. The pixel arrangement structure according to claim 9, wherein each of the third sub-pixels comprises a third light-emitting material region and a third pixel region positioned in the third light-emitting material region, and the third opening sides and the fourth opening sides are sides of the third light-emitting material region;

the third pixel region comprises two third pixel sides arranged in parallel with the third opening sides, two fourth pixel sides arranged in parallel with the fourth opening sides, and a second pixel chamfered side arranged in parallel with the second chamfered side, extending lines of the third pixel side and the fourth pixel side at two ends of the second pixel chamfered side form a virtual pixel angle;

a distance Q between the second pixel chamfered side and the virtual pixel angle satisfies the following relationship:

$$Q = \left(\frac{d_1}{2} + d_2\right) - \left[\frac{\sqrt{2}\,d_2}{2} - \frac{d_3}{\sqrt{2}}\right] \tag{1}$$

wherein $d_1$ is a first spacing between third light-emitting material regions of the two third sub-pixels in the pixel unit along the first direction, $d_2$ is a second spacing between a side of the third light-emitting material region and a side of the third pixel region in a same third sub-pixel, and $d_3$ is a third spacing between the first sub-pixel and the second sub-pixel positioned between the two third sub-pixels in the same pixel unit and arranged along the second direction.

11. The pixel arrangement structure according to claim 7, wherein $H_1$ is a spacing between the two third opening sides, and $H_1=\sqrt{2}Pi-a$; wherein Pi is a pixel size, and a is a size of the first sub-pixel along an extending direction of the fourth opening side.

12. The pixel arrangement structure according to claim 11, wherein the pixel arrangement structure comprises a virtual quadrilateral, centers of the two first sub-pixels and centers of the two second sub-pixels are respectively positioned at four vertices of the virtual quadrilateral, the third sub-pixel is positioned in the virtual quadrilateral, a virtual square is formed, diagonals of the virtual quadrilateral are diagonals of the virtual square, and the pixel size is a side length of the virtual square.

13. The pixel arrangement structure according to claim 12, wherein the virtual quadrilateral is an isosceles trapezoid in shape.

14. The pixel arrangement structure according to claim 7, wherein $H_2$ is a spacing between the two fourth opening sides, and $H_2 = \sqrt{2}Pi - b$; wherein Pi is a pixel size, and b is a size of the second sub-pixel along an extending direction of the third opening side.

15. The pixel arrangement structure according to claim 14, wherein the pixel arrangement structure comprises a virtual quadrilateral, four vertices of the virtual quadrilateral are respectively positioned at centers of the two first sub-pixels and centers of the two second sub-pixels, the third sub-pixel is positioned in the virtual quadrilateral, a virtual square is formed, diagonals of the virtual quadrilateral are diagonals of the virtual square, and the pixel size is a side length of the virtual square.

16. The pixel arrangement structure according to claim 15, wherein the virtual quadrilateral is an isosceles trapezoid in shape.

17. A mask component, wherein the mask component is configured to form, by evaporation, the pixel arrangement structure according to claim 1, and the mask component comprises:

a first mask plate comprising a first mask opening adapted to the first sub-pixel;

a second mask plate comprising a second mask opening adapted to the second sub-pixel;

a third mask plate comprising a third mask opening adapted to the third sub-pixel.

18. A display panel, comprising the pixel arrangement structure according to claim 1.

\* \* \* \* \*